(12) United States Patent
Posamentier

(10) Patent No.: US 7,733,216 B2
(45) Date of Patent: Jun. 8, 2010

(54) RADIO FREQUENCY IDENTIFICATION TAGS CAPABLE OF EMBEDDING RECEIVER SIGNAL STRENGTH INDICATIONS

(75) Inventor: Joshua Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 850 days.

(21) Appl. No.: 11/180,929

(22) Filed: Jul. 12, 2005

(65) Prior Publication Data

US 2007/0013517 A1 Jan. 18, 2007

(51) Int. Cl.
*H04Q 5/22* (2006.01)

(52) U.S. Cl. ................ 340/10.1; 340/572.1; 340/572.4; 340/10.5

(58) Field of Classification Search ............... 340/572.1, 340/572.4, 10.1, 10.4, 10.5
See application file for complete search history.

(56) References Cited

U.S. PATENT DOCUMENTS

| | | | | |
|---|---|---|---|---|
| 6,002,942 A | * | 12/1999 | Park | 455/522 |
| 7,185,449 B2 | * | 3/2007 | Kime | 37/234 |
| 7,239,242 B2 | * | 7/2007 | Ghosh | 340/572.1 |
| 2003/0228857 A1 | * | 12/2003 | Maeki | 455/278.1 |
| 2006/0016866 A1 | | 1/2006 | Oakes et al. | |
| 2006/0022800 A1 | * | 2/2006 | Krishna et al. | 340/10.2 |
| 2006/0164213 A1 | * | 7/2006 | Burghard et al. | 340/10.2 |

FOREIGN PATENT DOCUMENTS

| | | |
|---|---|---|
| DE | 4227551 A1 | 2/1994 |
| DE | 10050321 A1 | 4/2004 |
| EP | 1359538 A2 | 11/2003 |
| FR | 2746200 A1 | 9/1997 |

OTHER PUBLICATIONS

International Search Report and Written Opinion of the EP Searching Authority; Dated Sep. 1, 2007; PCT/US2006/062989, 13 pgs.

* cited by examiner

*Primary Examiner*—Travis R Hunnings
(74) *Attorney, Agent, or Firm*—Pillsbury Winthrop Shaw Pittman LLP

(57) ABSTRACT

An embodiment of the present invention provides an apparatus, comprising an RF ID tag capable of reporting receiver signal strength indication, wherein the receiver signal strength may be indicated by an a RSSI byte included with an electronic product code (EPC) data packet. The EPC data packet may be in the standard SGTIN-64 EPC data format. Further, the RF ID tag capable of reporting signal strength may enable power control or beam steering.

44 Claims, 2 Drawing Sheets

RADIO FREQUENCY IDENTIFICATION TAGS CAPABLE OF EMBEDDING RECEIVER SIGNAL STRENGTH INDICATIONS

BACKGROUND

Although not limited in this respect, radio Frequency Identification (RFID) may refer to technologies that may use radio waves to identify objects. RFID systems may provide non-contact, non-line-of-sight identification. RFID systems may utilize three components, an antenna or coil, a transceiver (with decoder), and a transponder (RF tag) electronically programmed with unique information. However, it is understood that RFID systems may have more or less components based on the use requirements and the present invention is not limited to the RFID system comprising these components.

The antenna may send out radio signals that activate the tag's electronics allowing data to be read and possibly written to the tag's electronically erasable programmable read-only memory (EEPROM). The antenna may be packaged with the transceiver and decoder to become an interrogator, typically called a reader even though it may write to writeable tags as well, although the present invention Is not limited in this respect. RFID tags may be read-only or read/write and may be read or written to through a variety of substances where barcodes or other optically read technologies would be useless. RFID tags may be categorized as either active or passive where passive tags may obtain power from the reader and operate without a separate external power source while an internal battery powers active tags.

Current RFID tags cannot report their local power detected but rather the RFID reader has to rely solely on the tag reflected power for any kind of power control. Further, current tags have no provisions for reporting their individual power level other than an absolute cut-off when there is not enough power to power the tag Thus, a strong need exists for radio frequency identification tags capable of reporting receiver signal strength indications and for methods of operation therefore.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
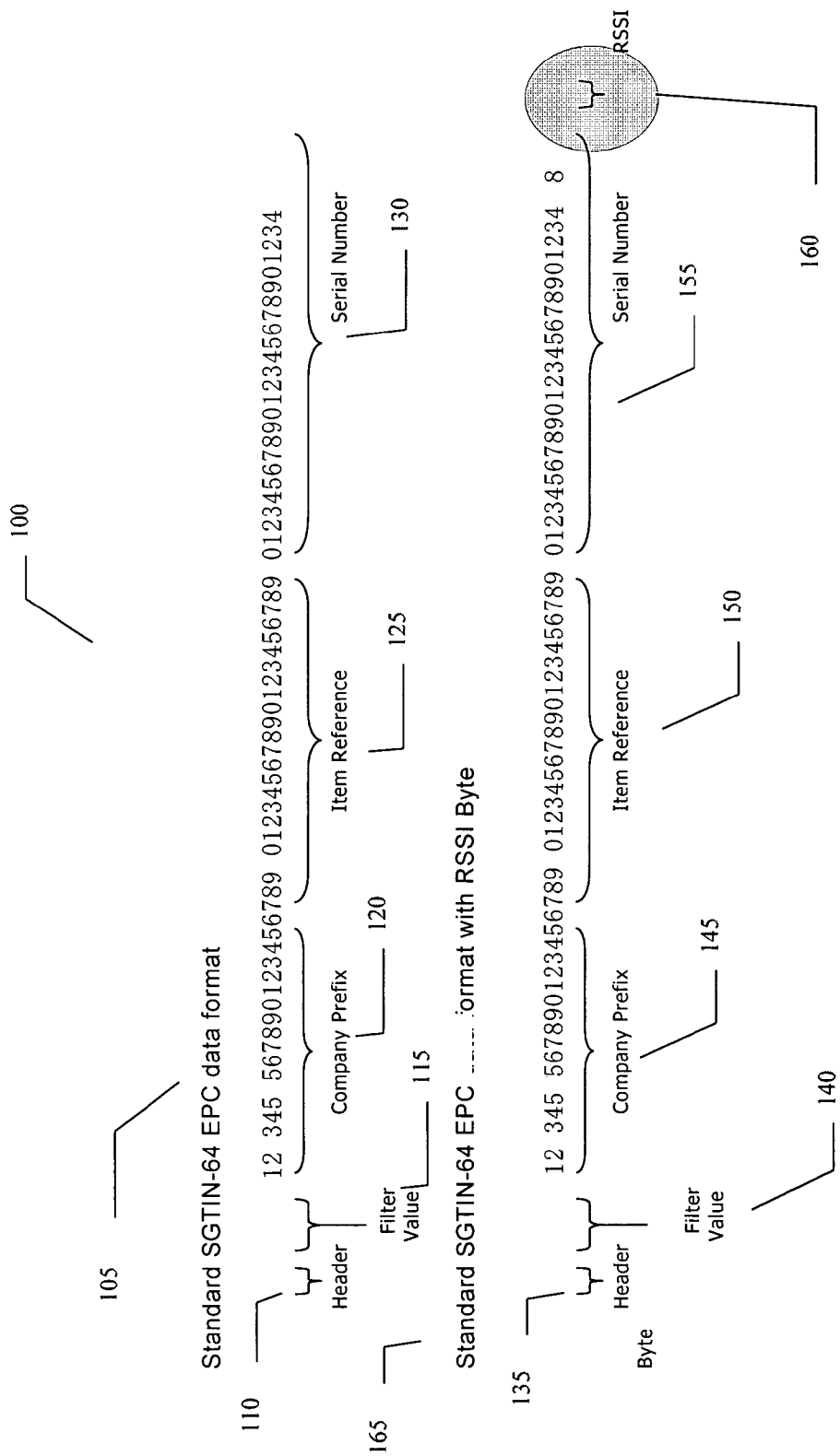
FIG. 1 illustrates an EPC data packet in the standard SGTIN-64 EPC data format and an EPC data packet in the standard SGTIN-64 EPC data format with an RSSI Byte.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

An embodiment of the present invention provides an apparatus, system and method capable of measuring and reporting receiver signal strength indication (RSSI) on an RFID tag which in turn provides per tag RSSI which enables features such as specific tag location via reader beam steering. It also enables the reader to reduce power on a per read basis to minimize interference with other readers in noisy environments.

It is understood, however, that the present invention is not limited to power control and potentially beam steering (i.e. phased array or RF lens array antenna system control) and tag positioning. Turning to FIG. 1, illustrated generally as 100, is a standard electronic product code (EPC) data packet 105 which includes header 110 and filter value 115, as well as company prefix 120, item reference 125 and serial number 130. At 165 is illustrated an EPC data packet in the standard SGTIN-64 EPC data format with an RSSI Byte indicator 160 in addition to header 135 and filter value 140, as well as company prefix 145, item reference 150 and serial number 155.

Figure 2:
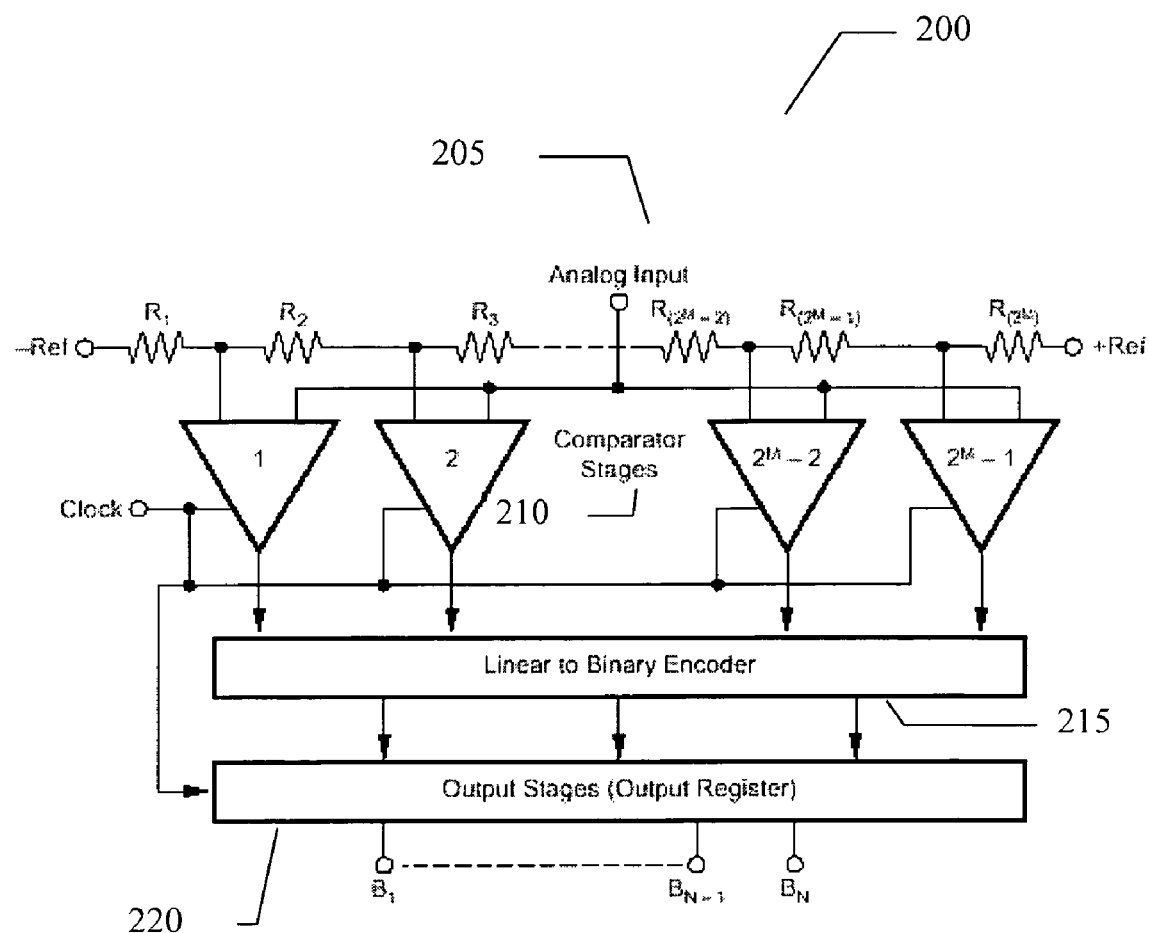
FIG. 2 illustrates a Flash Analog/Digital converter (ADC) with logarithmic optional of one embodiment of the present invention.

Turning now to FIG. 2 is illustrated a Flash Analog/Digital converter (ADC) 200 with logarithmic optional of one embodiment of the present invention. Although the present invention is not limited in this respect, this circuit may generate the RSSI byte enabling the measuring of the power supply with a low power reference. This may be a low power device that may have its output latched into the response register at the end of the Reader-to-tag communication, although it is not required to be. This ADC 200 may include analog input 205 with comparator stages 210 and linear to binary encoder 215 output to output register 220.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An apparatus, comprising: a passive RF ID tag configured to report receiver signal strength indication, wherein said receiver signal strength is indicated by an RSSI byte included with an electronic product code (EPC) data packet, wherein the RF ID tag comprises a flash analog/digital converter having output latched into a response register and arranged to generate the RSSI byte that is configured to enable measuring a power supply with a low power reference signal.

2. The apparatus of claim 1, wherein said EPC data packet is in the standard SGTIN-64 EPC data format.

3. The apparatus of claim 1, wherein said RF ID tag configured to report signal strength enables power control.

4. The apparatus of claim 1, wherein said RF ID tag configured to report signal strength enables beam steering.

5. A method of reporting receiver signal strength indication in a passive RF ID tag, comprising:
reporting, by the passive RF ID tag, the receiver signal strength by including a RSSI byte with an EPC data packet,
wherein the RF ID tag comprises a flash analog/digital converter having output latched into a response register and arranged to generate the RSSI byte that is configured to enable measuring a power supply with a low power reference signal.

6. The method of claim 5, further comprising adapting said EPC data packet to the standard SGTIN-64 EPC data format.

7. The method of claim 5, further comprising enabling power control of said RF ID tag by reporting signal strength.

8. The method of claim 5, further comprising enabling beam steering by reporting signal strength.

9. An article, comprising:
a storage medium having stored thereon instructions, that, when executed by a computing platform results in a passive RF ID tag reporting receiver signal strength, wherein said receiver signal strength is indicated by an RSSI byte included with an EPC data packet, wherein the RF ID tag comprises a flash analog/digital converter having output latched into a response register and arranged to generate the RSSI byte that is configured to enable measuring a power supply with a low power reference signal.

10. The article of claim 9, wherein said EPC data packet is in the standard SGTIN-64 EPC data format.

11. The article of claim 9, wherein said reporting of signal strength enables power control.

12. The article of claim 9, wherein said reporting of signal strength enables beam steering.

13. A passive RF ID Tag, comprising:
a transponder configured to report receiver signal strength, wherein said receiver signal strength is indicated by an RSSI byte included with an EPC data packet; and
a flash analog/digital converter having output latched into a response register and arranged to generate the RSSI byte that is configured to enable measuring a power supply with a low power reference signal.

14. The RF ID Tag of claim 13, wherein said EPC data packet is in the standard SGTIN-64 EPC data format.

15. The RF ID Tag of claim 13, wherein said transponder configured to report signal strength enables power control.

16. The RF ID Tag of claim 13, wherein said transponder configured to report signal strength enables beam steering.

17. A tracking system, comprising:
an antenna;
a transceiver connected to said antenna; and
a passive transponder (RF tag) configured to communicate with said transceiver, wherein said transponder is configured to report received signal strength, wherein said receiver signal strength is indicated by an RSSI byte included with an EPC data packet, wherein the transponder comprises a flash analog/digital converter having output latched into a response register and arranged to generate the RSSI byte that is configured to enable measuring a power supply with a low power reference signal.

18. A method of controlling the power in a transceiver in a passive RF ID Tag system, comprising:
receiving from a transponder configured to report received signal strength the strength of a signal received from said transceiver; and
adjusting the transmit power of said transceiver based upon the reported received signal strength and predetermined parameters, wherein said receiver signal strength is indicated by an RSSI byte included with an EPC data packet, wherein the RF ID tag comprises a flash analog/digital converter having output latched into a response register and arranged to generate the RSSI byte that is configured to enable measuring a power supply with a low power reference signal.

19. A method of determining Tag location in a passive RF ID Tag system, comprising:
receiving from a transponder configured to report received signal strength the strength of a signal received from a transceiver in said passive RFID Tag system; and
beam forming on the basis of the reported received signal strength thereby enabling the determination of a tag in said passive RFID Tag system, wherein said receiver signal strength is indicated by an RSSI byte included with an EPC data packet,
wherein the RF ID tag system comprises RF ID tags comprising a flash analog/digital converter having output latched into a response register and arranged to generate the RSSI byte that is configured to enable measuring a power supply with a low power reference signal.

20. An apparatus, comprising:
an RF ID tag configured to report receiver signal strength indication, wherein the RF ID tag comprises a flash analog/digital converter having output latched into a response register and arranged to generate a RSSI byte that is configured to enable measuring a power supply with a low ppwer reference signal.

21. The apparatus of claim 20, wherein said receiver signal strength is indicated by the RSSI byte included with an electronic product code (EPC) data packet.

22. The apparatus of claim 21, wherein said EPC data packet is in the standard SGTIN-64 EPC data format.

23. The apparatus of claim 20, wherein said RF ID tag configured to report signal strength enables power control.

24. The apparatus of claim 20, wherein said RF ID tag configured to report signal strength enables beam steering.

25. An article, comprising:
a storage medium having stored thereon instructions, that, when executed by a computing platform results in a RF ID tag reporting receiver signal strength, wherein the RF ID tag comprises a flash analog/digital converter having output latched into a response register and arranged to generate a RSSI byte that is configured to enable measuring a rower supply with a low power reference signal.

26. The article of claim 25, wherein said receiver signal strength is indicated by the RSSI byte included with an EPC data packet.

27. The article of claim 26, wherein said EPC data packet is in the standard SGTIN-64 EPC data format.

28. The article of claim 25, wherein said reporting of signal strength enables power control.

29. The article of claim 25, wherein said reporting of signal strength enables beam steering.

30. A RF ID Tag, comprising:
a transponder configured to report receiver signal strength, wherein the RF ID tag comprises a flash analog/digital converter having output latched into a response register and arranged to generate a RSSI byte that is configured to enable measuring a power supply with a low power reference signal.

31. The RF ID Tag of claim 30, wherein said receiver signal strength is indicated by the RSSI byte included with an EPC data packet.

32. The RF ID Tag of claim 31, wherein said EPC data packet is in the standard SGTIN-64 EPC data format.

33. The RF ID Tag of claim 30, wherein said transponder configured to report signal strength enables power control.

34. The RF ID Tag of claim 30, wherein said transponder configured to report signal strength enables beam steering.

35. A tracking system, comprising:
an antenna;
a transceiver connected to said antenna; and
a transponder (RF tag) configured to communicate with said transceiver, wherein said transponder is configured to report received signal strength, wherein the transponder comprises a flash analog/digital converter having output latched into a response register and arranged to generate a RSSI byte that is configured to enable measuring a power supply with a low power reference signal.

36. The tracking system of claim 35, wherein said receiver signal strength is indicated by the RSSI byte included with an EPC data packet.

37. A method of controlling the power in a transceiver in a RF ID Tag system, comprising:
receiving from a transponder configured to report received signal strength the strength of the signal received from said transceiver; and
adjusting the transmit power of said transceiver based upon the reported received signal strength and predetermined parameters,
wherein the transponder comprises a flash analog/digital converter having output latched into a response register and arranged to generate a RSSI byte that is configured to enable measuring a power supply with a low power reference signal.

38. The method of claim 37, wherein said receiver signal strength is indicated by the RSSI byte included with an EPC data packet.

39. A method of determining Tag location in a RF ID Tag system, comprising:
receiving from a transponder configured to report received signal strength the strength of the signal received from a transceiver in said passive RFID Tag system; and
beam forming on the basis of the reported received signal strength thereby enabling the determination of a tag in said passive RFID Tag system,
wherein the transponder comprises a flash analog/digital converter having output latched into a response register and arranged to generate a RSSI byte that is configured to enable measuring a power supply with a low power reference signal.

40. The method of claim 39, wherein said receiver signal strength is indicated by the RSSI byte included with an EPC data packet.

41. An apparatus, comprising:
a RF ID tag configured to report receiver signal strength indication, wherein said receiver signal strength is indicated by an RSSI byte included with an electronic product code (EPC) data packet, wherein the RF ID tag system comprises RF ID tags comprising a flash analog/digital converter having output latched into a response register and arranged to generate the RSSI byte that is configured to enable measuring a power supply with a low power reference signal.

42. A method of reporting receiver signal strength indication in a RF ID tag, comprising:
reporting, by the RF ID tag, the receiver signal strength by including a RSSI byte with an EPC data packet; and
generating the RSSI byte that is configured to enable measuring a power supply with a low power reference signal by a flash analog/digital converter having an output latched into a response register of the RF tag.

43. A RF ID Tag, comprising:
a transponder configured to report received signal strength, wherein said receiver signal strength is indicated by an RSSI byte included with an EPC data packet wherein the transponder includes a flash analog/digital converter having output latched into a response register and arranged to generate the RSSI byte that is configured to enable measuring a power supply with a low power reference signal.

44. A tracking system, comprising:
an antenna;
a transceiver connected to said antenna; and
a transponder (RF tag) configured to communicate with said transceiver, wherein said transponder is configured to report received signal strength, wherein said receiver signal strength is indicated by an RSSI byte included with an EPC data packet, wherein the transponder includes a flash analog/digital converter having output latched into a response register and arranged to generate the RSSI byte that is configured to enable measuring a power supply with a low power reference signal.

* * * * *